(12) United States Patent
Singer et al.

(10) Patent No.: US 9,431,261 B2
(45) Date of Patent: Aug. 30, 2016

(54) REMOVAL OF DEFECTS BY IN-SITU ETCHING DURING CHEMICAL-MECHANICAL POLISHING PROCESSING

(71) Applicant: The Boeing Company, Chicago, IL (US)

(72) Inventors: Scott B. Singer, Sherman Oaks, CA (US); Joseph C. Boisvert, Thousand Oaks, CA (US); Daniel C. Law, Arcadia, CA (US); Christopher M. Fetzer, Valencia, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/556,337

(22) Filed: Dec. 1, 2014

(65) Prior Publication Data

US 2016/0155644 A1    Jun. 2, 2016

(51) Int. Cl.
*H01L 21/306* (2006.01)
*H01L 21/308* (2006.01)
*C09G 1/02* (2006.01)

(52) U.S. Cl.
CPC ............ *H01L 21/30625* (2013.01); *C09G 1/02* (2013.01); *H01L 21/308* (2013.01); *H01L 21/30604* (2013.01)

(58) Field of Classification Search
None
See application file for complete search history.

(56) References Cited

U.S. PATENT DOCUMENTS

| 7,951,719 | B2 | 5/2011 | Brewer | |
| 2005/0186800 | A1 | 8/2005 | Brewer | |
| 2006/0218867 | A1* | 10/2006 | Koshiyama | C09K 3/1463 |
| | | | | 51/308 |
| 2008/0265375 | A1 | 10/2008 | Pietsch et al. | |

FOREIGN PATENT DOCUMENTS

| EP | 2779216 A1 | 9/2014 |
| JP | 2000031163 | 1/2000 |
| WO | 2013018015 A2 | 2/2013 |

OTHER PUBLICATIONS

Extended European Search Report dated Feb. 26, 2016, European Application No. 15194346.1, pp. 1-7.

* cited by examiner

*Primary Examiner* — Anita Alanko
(74) *Attorney, Agent, or Firm* — MH2 Technology Law Group, LLP

(57) ABSTRACT

Technologies for a process used to reduce the height of a raised profile of a device. One or more raised profiles on one or more layers of a device are removed using a combined chemical-mechanical polishing/etching process. In some implementations, a protective layer is applied to a top layer of a device grown on a substrate. A combined chemical-mechanical polishing/etching process may commence whereby one or more raised profiles of the protective layer are removed through a planarization process, exposing at least a portion of a raised profile of a layer below the protective layer. Material may be removed using an etchant to reduce the height of the raised profile.

12 Claims, 12 Drawing Sheets

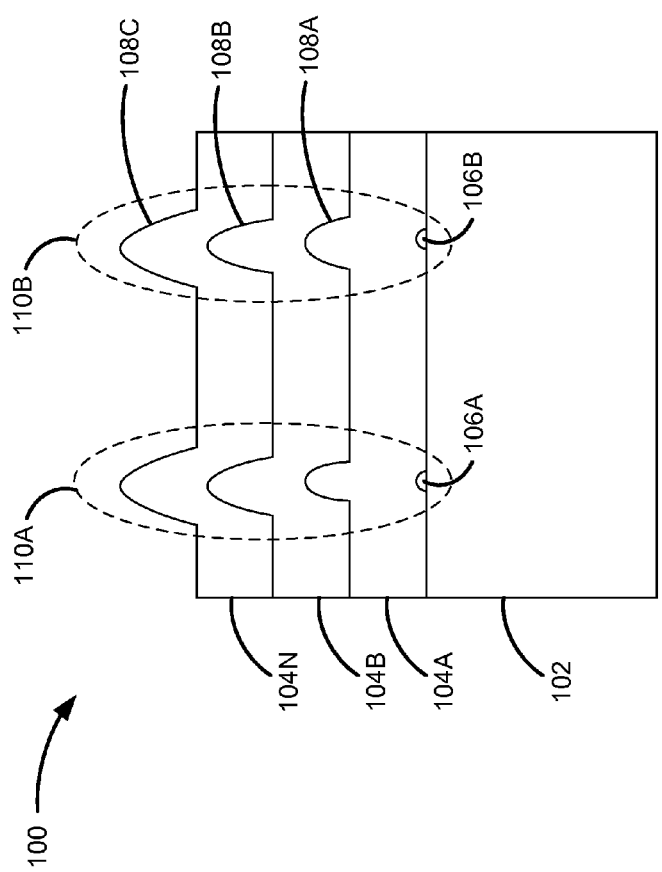

REMOVAL OF DEFECTS BY IN-SITU ETCHING DURING CHEMICAL-MECHANICAL POLISHING PROCESSING

GOVERNMENTAL RIGHTS

This invention was made with Government support under contact no. NRO000-11-C-0599 awarded by the Department of Defense. The government has rights in this invention.

BACKGROUND

During the manufacture of epitaxial device wafers, particles (or defects) may form, or be deposited, on a surface of one or more layers of the wafer. As additional layers are epitaxially-grown, particles on one surface may cause one or more locations on subsequently grown surfaces to have a raised profile, typically in the location above the particle. As each additional layer is deposited, the height of the raised profile (or bump) in the additional layers caused by the particle or other bumps may increase.

In some manufacturing processes, a wafer may be bonded to another wafer using various processes such as an inverted metamorphic ("IMM") manufacturing process. In an IMM manufacturing process, one wafer having one or more layers is inverted and bonded in some manner to another wafer, also having one or more layers. In some instances, if the raised profiles caused by particles are significant enough, the bonding process may render the resulting device inoperable. For example, the raised profile may cause structural damage to one or more layers of either wafer because of the relatively greater pressure experienced in the location of the raised profile during a bonding process using pressure as compared to other locations.

It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

According to some examples, a method to process a device is described. According to implementations, the method includes epitaxially growing at least one layer of material on a substrate, the at least one layer comprising a defect region, depositing a protective layer over at least a portion of the at least one layer of material, and performing a chemical-mechanical planarization ("CMP")/etching process. In some implementations, the CMP/etching process comprises receiving the device into a planar machine, rotating a planar pad and introduce a slurry comprising a compound configured to etch material from at least a portion of the defect region, planing the device until an area of the defect region is exposed to the slurry, and continuing the CMP/etching process until a desired amount of material is removed from the defect region.

According to other examples, a computer-readable storage medium is described. According to implementations, the computer-readable storage medium has instructions stored thereon which, when executed by a processor of a planar machine, cause the planar machine to receive a wafer having at least one epitaxially grown layer and at least one protective layer, the at least one layer comprising a defect region, and perform a chemical-mechanical planarization ("CMP")/etching process. In some implementations, the CMP/etching process comprises operations to rotate a planar pad, introduce a slurry comprising a compound configured to etch material from at least a portion of the defect region, plane the device until an area of the defect region is exposed to the slurry, and continue CMP/etching process until a desired amount of material is removed from the defect region.

According to further examples, a slurry for a chemical-mechanical polishing/etching process is described. According to implementation, the slurry may include a compound configured to reduce a hardness of the protective layer, and an etchant configured to target material in a defect region of a device.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein:

FIG. 1B is a cross-sectional view taken along line A-A of the device in FIG. 1A.

DETAILED DESCRIPTION

The following detailed description is directed to technologies for a process used to reduce the height of a raised profile of a device. According to various embodiments, one or more raised profiles on one or more layers of a device are removed using a combined chemical-mechanical polishing ("CMP")/etching process. In some implementations, a protective layer is applied to a top layer of a device grown on a substrate. A CMP process may commence whereby one or more raised profiles of the protective layer are removed through a planarization process, exposing at least a portion of a raised profile of a layer below the protective layer.

The CMP process may continue, whereby a component of a compound used in the CMP process acts as an etchant. The etchant may chemically and mechanically act on raised profiles of one or more layers of the device, whereby the etchant enters the one or more layers through the exposed portion created by the CMP process. In some implementations, the protective layer is relatively inert to the etchant. The CMP/etching process may continue for a period of time to remove all or a portion of the raised profiles of one or more layers of the device. In some implementations, the device may include an etch stop layer that acts as a barrier to reduce the etch rate of the etchant.

These and some other aspects of the presently disclosed subject matter are described in further detail, below. In the following description, references are made to the accompanying drawings that form a part hereof, and which are shown by way of illustration, specific embodiments, or examples. Like numerals represent like elements through the several figures.

Figure 1A:
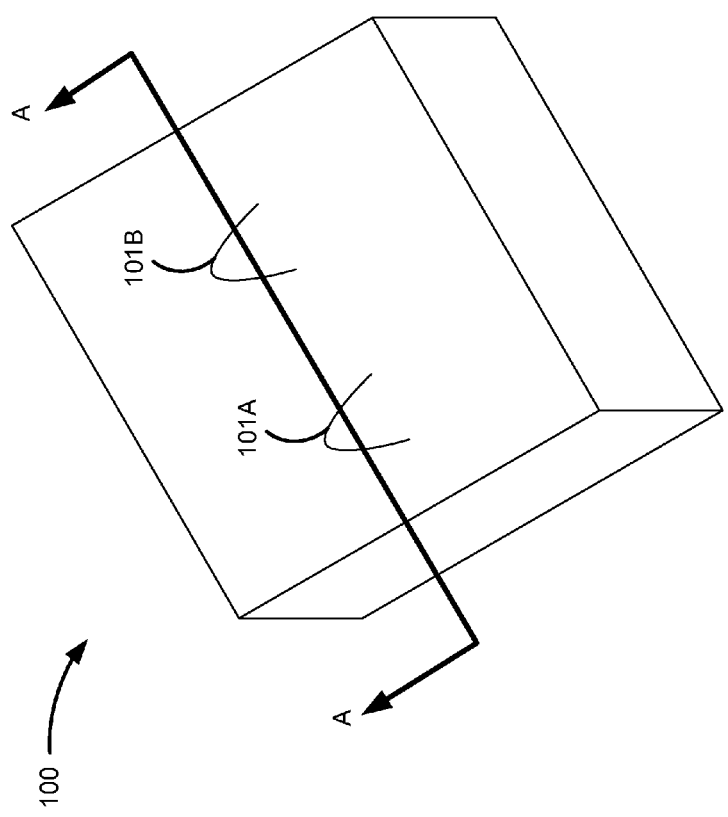
FIG. 1A is a perspective view of a device having epitaxially grown layers illustrating the effects of a particle.

FIG. 1A is a perspective view of a device 100 having epitaxially grown layers illustrating the effects of a particle. In FIG. 1A, the device 100 has deformations 101A and 101B. FIG. 1B is a cross-sectional view of the device 100 taken along the line A-A.

FIG. 1B is a cross-sectional view of a device 100 having epitaxially grown layers illustrating the effects of a particle. The device 100 of FIG. 1B is formed from a substrate 102 and layers 104A-104N (collectively referred to herein as the "layers 104" and individually as the "layer 104A," the "layer 104B," and so forth). The presently disclosed subject matter is not limited to any particular substrate 102. The substrate 102 may be, but is not limited to, a gallium arsenide-, silicon-, or germanium-based substrate.

In some examples, the layers 104 are epitaxially grown. As used herein, epitaxially grown means that layers are formed by the deposition of gas or liquid on a layer whereby the newly formed layer has an ordered crystalline structure (or registry) with respect to the layer upon which the newly formed layer is grown. Although the description herein is referred to in terms of epitaxial growth, it should be understood that the presently disclosed subject matter may be used on other types of processes for forming layers and is not limited to an epitaxial process.

Returning to FIG. 1B, during one or more processes, a particle 106A and/or a particle 106B (collectively referred to herein as the "particles 106" and individually as the "particle 106A," and the "particle 106B") may be deposited on the substrate 102 (or any other layer of the device 100). The composition and source of the particles 106 may vary. For example, the particles 106 may be dust or dirt collected in the manufacturing facility. In another example, the particles 106 may be portions of a gas or liquid used to create a layer that do not form correctly. In some processes, the particles 106 may be dust or dirt deposited on one of the layers 104 when the device 100 is loaded into or removed from a process machine, such as a metal-organic chemical vapor deposition chamber. The presently disclosed subject matter is not limited to any particle manner in which the particles 106 are formed or the composition of the particles.

If the particles 106 are present on one or more layers 104 of the device 100 when subsequently formed layers are deposited a raised profile of the subsequently deposited layers may be created. In the example illustrated in FIG. 1B, when the layer 104A is formed, the raised profile 108A is created due to the presence of the particle 106B. The layer 104B has a raised profile 108B, which is created due to the presence of the particle 106B and the raised profile 108A. As the layers 104 are formed, subsequent raised profiles may be formed resulting in a raised profile in a top layer, for example, a raised profile 108C. The raised profiles 108C may correspond to, or be a cause of, the deformations 101A or 101B of FIG. 1A.

The raised profiles, such as the raised profiles 108A-108C, may create a defect region, such as defect regions 110A and 110B (collectively referred to herein as the "defect regions 110" and individually as the "defect region 110A," and the "defect region 110B"). If left untreated, the defect regions 110 may cause the device to be inoperable or unsuitable for its intended purpose. In some examples, the defect regions 110 may be areas in which applied pressure may cause one or more layers to partially or wholly lift off (or separate from) adjacent layers. In other examples, the defect regions 110 may cause structural damage to one or more layers 104 or the substrate 102. The presently disclosed subject matter is not limited to any particular type of damage or defect of the device 100 caused by the defect regions 110.

Figure 2:
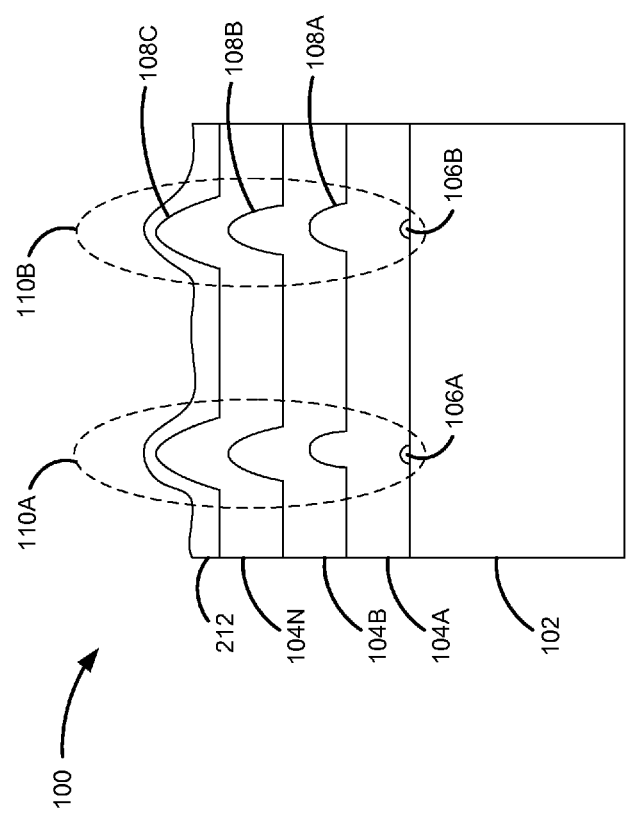
FIG. 2 is a cross-sectional view of a device having a protecting layer in a process used to reduce the height of a raised profile according to at least one embodiment disclosed herein.

FIG. 2 is a cross-sectional view of the device 100 having a protective layer 212 in a process used to reduce the height of the raised profiles 108. As discussed in FIG. 1B, the device 100 has defect regions 110 formed from the particles 106. The defect regions 110 may represent an area of the device 100 that may affect the operation of the device 100 if left untreated. To reduce the probability that the defect regions 110 may have an effect on the device 100, the height of one or more raised profiles in the defect regions 110 may be reduced.

In various implementations, the height may be reduced through a combined CMP/etching process. In some implementations, the etchant used may be particularly suited to the composition of the layers 104. In further implementations, the etchant may have a composition or concentration designed to cause an aggressive etch rate, i.e. a rate of etch caused by a relatively high chemical reactivity between the etchant and the layers 104. Additional aspects of the etchant are described in more detail below.

To protect various portions of the device 100 from an etchant, the protective layer 212 may be deposited on one of the layers 104, in some examples, on the top layer 104N. As discussed above, in some examples, the protective layer 212 may be relatively inert to an etchant used to reduce raised profiles. In some examples, the hardness of the protective layer 212 may be affected by an etchant or a slurry used in the CMP/etch process.

In some examples, a slurry may include an oxidizing agent (or other chemical) that may soften the protective layer 212. The softening of the protective layer 212 may allow for relatively quickly planarization. In some examples, the protective layer 212 may be comprised of a conformal layer formed from, by way of example and not by way of limitation, $SiO_2$ or $Si_3N_4$. The protective layer 212 may be deposited using various methods such as, but not limited to, plasma-enhanced chemical vapor deposition, low pressure chemical vapor deposition, or e-beam or thermal evaporation. Once the protective layer 212 is deposited, the CMP/etching process may begin, described in more detail below.

Figure 3:
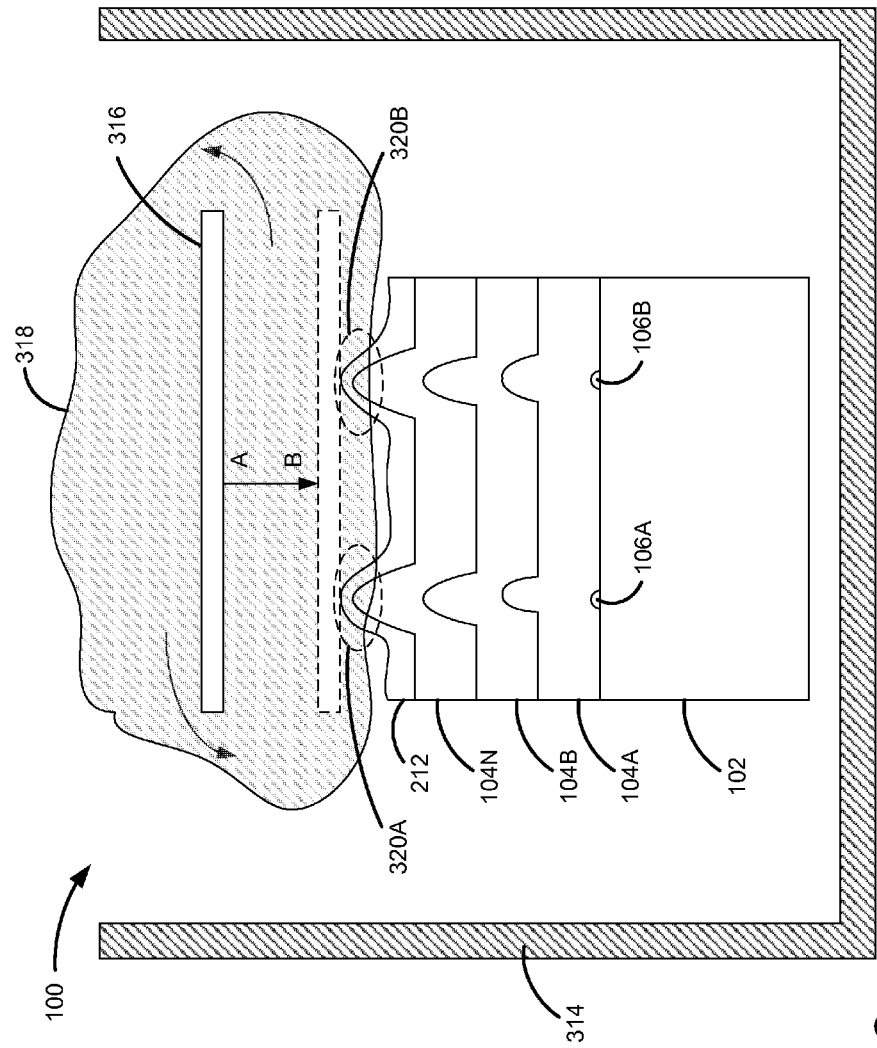
FIG. 3 is a cross-sectional view of a device undergoing chemical-mechanical polishing to reduce the height of a raised profile according to at least one embodiment disclosed herein.

FIG. 3 is a cross-sectional view of the device 100 undergoing chemical-mechanical polishing to reduce the height of a raised profile. The device 100 having the layers 104 and the protective layer 212 may be placed within a planar machine 314. The planar machine 314 may include a planar pad 316. The planar pad 316 may be constructed from various materials designed to remove portions of the device 100 in a mechanical manner.

The planar machine 314 may be configured to rotate the planar pad 316. It should be noted that the planar pad 316 may be moved in various manners to prove for a planing operation. For example, and not by way of limitation, the planar pad 316 may be vibrated or moved in a linear fashion. When the planar pad 316 is rotated and placed in contact with the device 100, the planar pad 316 may cause the removal of a portion of a layer of the device 100 through mechanical abrasion. The rate of rotation of the planar pad 316 along with the pressure applied by the planar pad 316 onto the surface of the device 100 may be adjusted to be suitable for a particular purpose.

The planar pad 316 may be configured and positioned to mechanically act on certain portions of the device 100 at different times. In one example, the planar pad 316 may be positioned to mechanically act on peaks 320A or 320B (collectively referred to herein as the "peaks 320" and individually as the "peak 320A," and the "peak 320B") prior to acting on other portions of the protective layer 212 of the device, including the layers 104.

A slurry 318 may be used to lubricate the process and to remove material removed from the protective layer 212 by the planar pad 316. The slurry 318 may include one or more liquids or solids that enhance the planar process performed by the planar pad 316. For example, the slurry 318 may include abrasive particles that, in combination with the material of the planar pad 316, enhance the mechanical removal action of the planar pad 316. In another example, the slurry 318 may also include one or more liquids to remove particulate removed from the device 100 by the planar pad 316. In one example, the liquid may be water or oil.

The mechanical remove of material from the protective layer 212 may also be enhanced through the use of an oxidizing agent to soften the hardness of the protective layer 212. Although not limited to any oxidizing agent, examples of oxidizing agents include, but are not limited to, compounds comprising at least one peroxy group. Some examples of oxidizing agents include, but are not limited to, peroxides, hydrogen peroxide, hydrohydrogen peroxides, persulfates such as monopersulfates and dipersulfates, percarbonates, and acids and salts thereof.

During processing, the device 100 may be loaded into the planar machine 314. The planar pad 316 may be move from position A to position B, position B being in contact with at least a portion of the surface of the protective layer 212 of the device 100. The slurry 318 may be introduced as the planar pad 316 comes in contact with the device 100, or at another suitable time. The planar pad 316 may be pressed onto the device 100 to provide some pressure on the protective layer 212 by the planar pad 316.

The planar pad 316 may be rotated at various stages of the process. As the planar pad 316 rotates, the action of the planar pad 316, along with the components in the slurry 318, may remove material from the peaks 320A or 320B. As material from the peaks 320 are removed, portions of the layer 104N proximate to the peaks 320 may be exposed to the slurry 318 or the planar pad 316, as described in more detail below.

Figure 4:
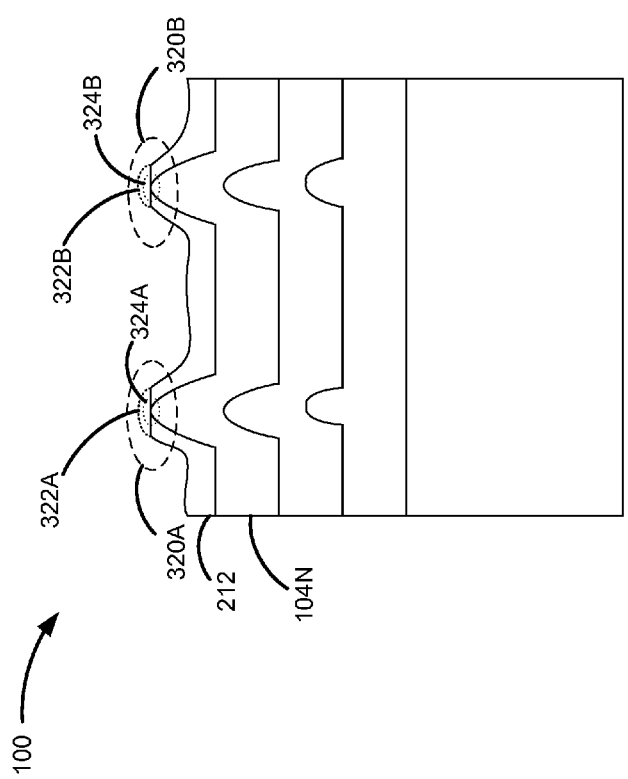
FIG. 4 is a cross-sectional view of a device illustrating the effects of chemical-mechanical polishing to reduce the height of a raised profile according to at least one embodiment disclosed herein.

FIG. 4 is a cross-sectional view of the device 100 illustrating the effects of chemical-mechanical polishing to reduce the height of the peaks 320. The device 100 is shown in a state during the CMP/etch process. Peak portion 322A from the peak 320A and peak portion 322B from the peak 320B have been removed (illustrated by dashed lines). Through the removal of the peak portions 322A and 322B, a top portion 324A of the layer 104N and a top portion 324B of the layer 104N may be exposed to the planar pad 316 and/or the slurry 318. The CMP/etching process may be continued, as illustrated in FIG. 5.

Figure 5:
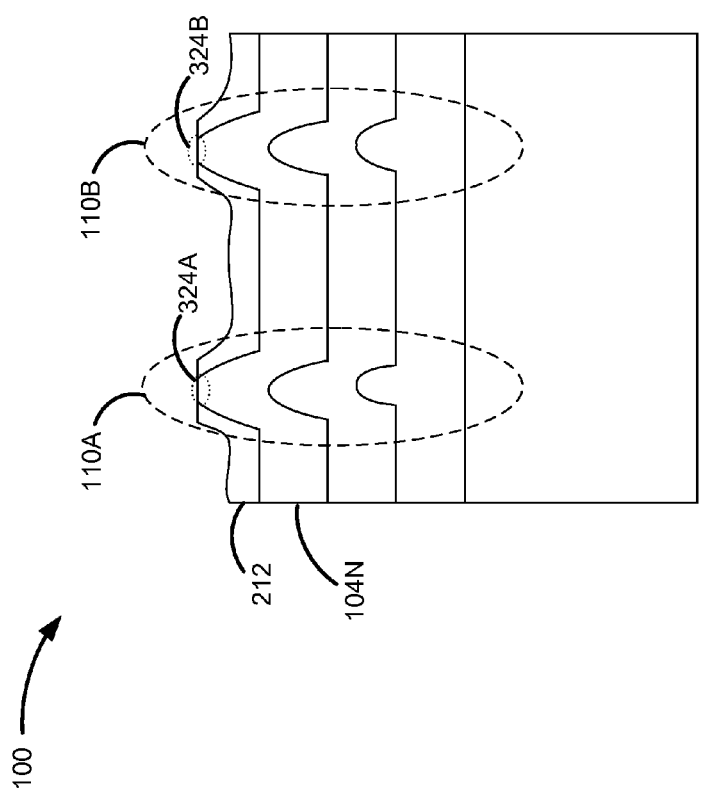
FIG. 5 is a cross-sectional view of a device illustrating the effects of additional chemical-mechanical polishing to reduce the height of a raised profile according to at least one embodiment disclosed herein.

FIG. 5 is a cross-sectional view of the device illustrating the effects of additional chemical-mechanical polishing to reduce the height of a raised profile. The device 100 is shown in a state during the CMP/etch process if the process is continued past the state illustrated in FIG. 4. In FIG. 5, size of the top portion 324A and the top portion 324B exposed to the planar pad 316 and/or the slurry 318 is increased in size. The additional size may allow for increased etch rates, among other possible benefits.

Figure 6:
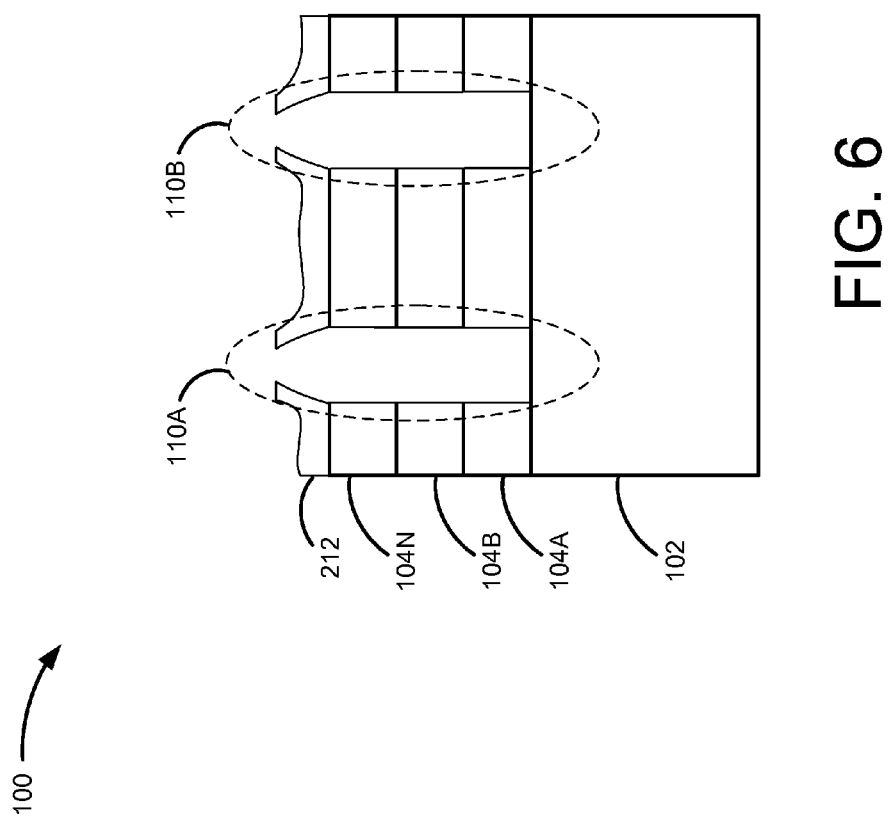
FIG. 6 is a cross-sectional view of a device illustrating the effects of etching to reduce the height of a raised profile according to at least one embodiment disclosed herein.

FIG. 6 is a cross-sectional view of the device illustrating the effects of etching to reduce the height of a raised profile. In FIG. 6, the device 100 is shown in a state after an etching process has occurred. In some examples, an etchant in the slurry 318 (of FIG. 3) enters the defect regions 110 through the exposed area of the layer 104N. An etchant may be configured to target portions of the defect regions 110.

For example, for the removal of arsenide-based III-V material, a solution for the slurry 318 may comprise, in a ratio of approximately 800:35:4:3, Nalco 2360 50 nm colloidal silica slurry, H2O, NaOCl, and citric acid. In other examples, chemistry used for arsenide-based III-V material may be 2000:100:x parts Nalco 2360 50 nm colloidal silica slurry, H2O2, and NH4OH, where x is greater than or equal to 3. The presently disclosed subject matter is not limited to any particular etchant formulation.

The etching process may remove all or some of the material in the defect regions 110. In FIG. 6, the material in the defect regions 110 is illustrated as being almost completely removed down to the substrate 102. It should be noted that different etching processes and chemicals may create different profiles. For example, the profile of the defection regions 110 is illustrated as having walls with relatively vertical profiles as determined from the top surface of the substrate 102. Other etching profiles may result depending on the particular etchant, the materials of the layers 104, and the like. The presently disclosed subject matter is not limited to any particular etching profile.

In some examples, the etching process may remove only a portion of the material in the defect regions 110. For example, the CMP/etching process may be stopped when only a portion of the material in the defect regions 110 is removed. In other examples, like the example illustrated in FIG. 6, the CMP/etching process may be continued until almost all of the material in the defect regions 110 is removed. The presently disclosed subject matter is not limited to particular amount of material removed. Once the desired amount of material is removed, the CMP/etching process may be halted and, thereafter, the protective layer 212 may be removed.

Figure 7:
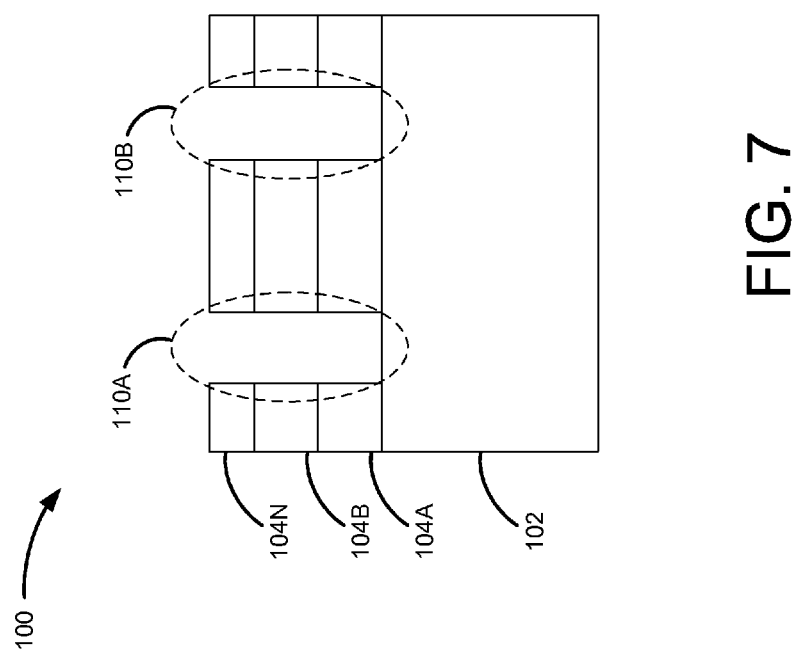
FIG. 7 is a cross-sectional view of a device illustrating the result of a process used to reduce the height of a raised profile according to at least one embodiment disclosed herein.

FIG. 7 is a cross-sectional view of the device 100 illustrating the result of a process used to reduce the height of a raised profile. In FIG. 7, the device 100 is shown in a state after the removal of the protective layer 212. The protective layer 212 may be removed using various technologies. For example, some protective layers 212 may be removed using an acidic solution such as hydrofluoric (HF) acid. The presently disclosed subject matter is not limited to any particular manner in which the protective layer 212 is removed.

As a result of the CMP/etching process and the removal of the protective layer 212, one or more of the raised profiles 108 (illustrated in FIG. 2) may be removed. In some implementations, because one or more of the raised profiles 108 may be removed, when the device 100 is bonded to another device (or another component), there may be a reduced probability of a defective device caused by the particles 106. In some configurations, the void created by the removal of the material in the defect regions 110 may be partially or wholly filled with another substance. In other configurations, the voids are left untouched and remain as such in the device 100 as illustrated in FIG. 7. As mentioned above, in some instances, an etch stop layer may be used and may affect the manner in which material is etched from the defect regions, described by way of example in FIG. 8.

Figure 8:
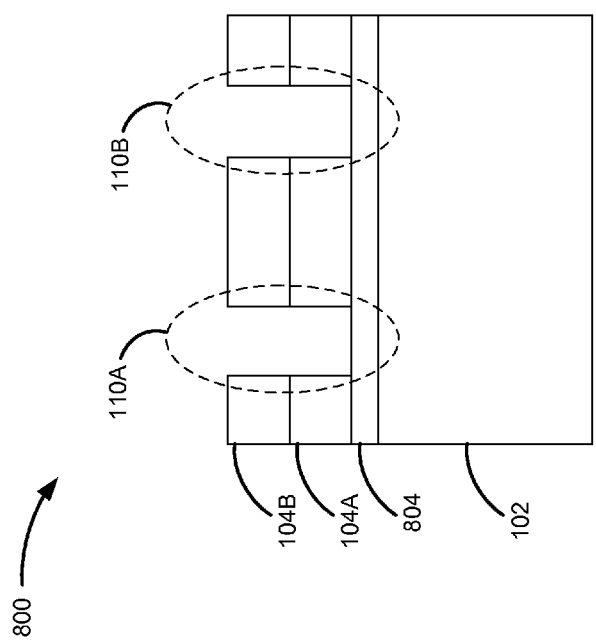
FIG. 8 is a cross-sectional view of a device having an etch stop layer illustrating the result of a process used to reduce the height of a raised profile according to at least one embodiment disclosed herein.

FIG. 8 is a cross-sectional view of a device 800 having an etch stop layer 804 illustrating the result of a process used to reduce the height of a raised profile. In FIG. 8, the device 800 includes the substrate 102 and the layers 104A and 104B. In some implementations, there may be one or more layers or areas of the layers that are preferentially protected from an etching process.

For example, some layers may have structures formed from material that are reactive to an etchant used in a process to form a device. An etching process may be used on one or more subsequently laid layers that may adversely affect other layers. In these and other instances, an etch stop layer, such as the etch stop layer 804, may be used.

In some configurations, the etch stop layer 804 is a layer of material that has significantly different etch characteristics than material to be etched. For example, the etch stop layer 804 may be a material that is essentially chemically inert to an etchant. In another example, the etch stop layer 804 may be portions of an otherwise etchable material that has been doped to have different etching characteristics than the layer without the dopant.

In one example, silicon may be doped with boron to create an etch stop layer. It should be noted that as used herein, "etch stop" does not mean that the etch stop layer 804 will experience no effects from an etching process, as some etch stop layers may be designed to simply have a higher resistance to the etching process than other regions to be etched. The presently disclosed subject matter is not limited to any particular technique.

In FIG. 8, the device 800 is in a state whereby portions of material have been etched from the defect regions 110. In the configuration illustrated in FIG. 8, the etch stop layer 804 has presented a barrier to an etchant to reduce or abate the etching process in a direction towards the substrate 102. In some configurations, a void created by the removal of the material in the defect regions 110 may be partially or wholly filled with another substance. In other configurations, voids are left untouched and remain as such in the device 800 as illustrated in FIG. 8.

Figure 9:
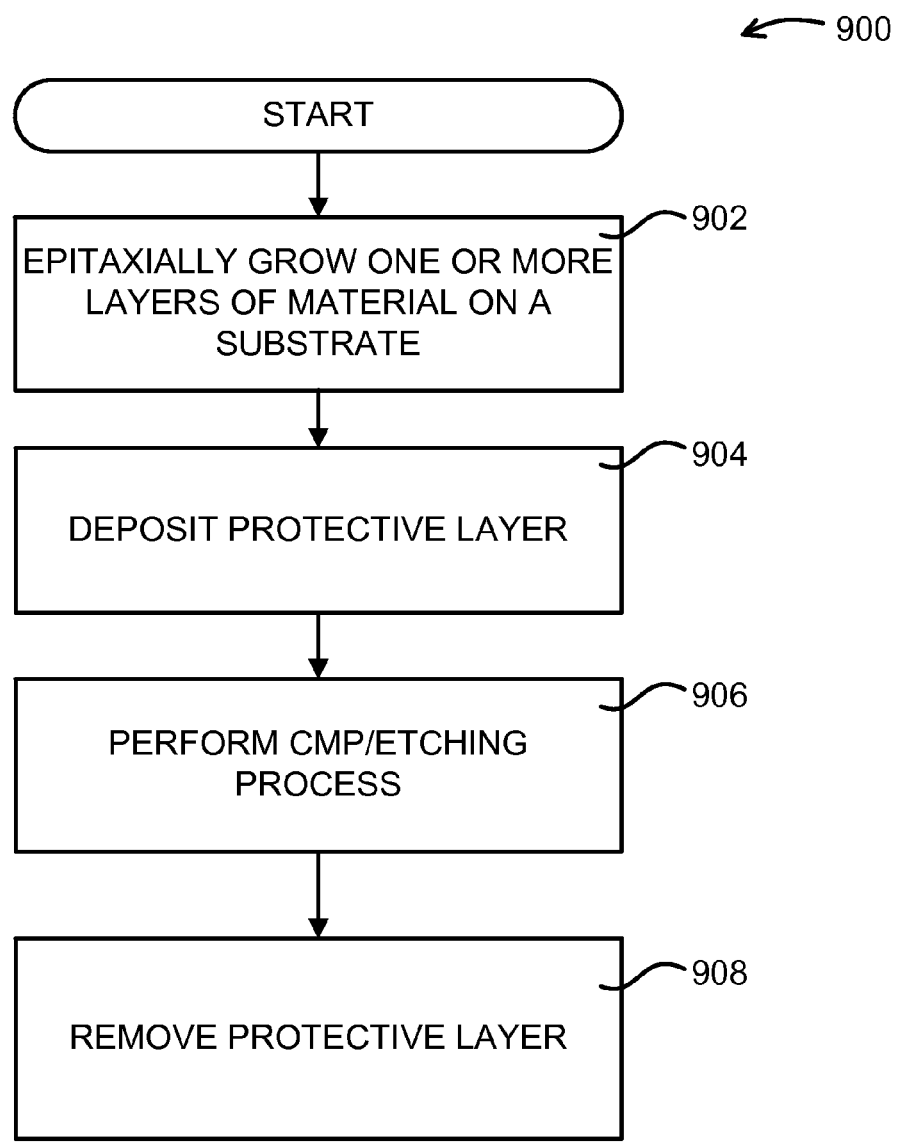
FIG. 9 illustrates one configuration of a routine for a process used to reduce the height of a raised profile according to at least one embodiment disclosed herein.

FIG. 9 illustrates one configuration of a routine 900 to reduce the height of a raised profile according to at least one embodiment disclosed herein. Unless otherwise indicated, more or fewer operations may be performed than shown in the figures and described herein. Additionally, unless otherwise indicated, these operations may also be performed in a different order than those described herein.

The routine 900 commences at operation 902 ("epitaxially grow one or more layers of material on a substrate"), where one or more layers of a material are epitaxially grown on a substrate. As mentioned above, the presently disclosed subject matter is not limited to epitaxially-grown devices, as the presently disclosed subject matter may be used in other types of devices.

The routine 900 continues to operation 904 ("deposit protective layer"), where a protective layer is deposited onto the top layer of material. In some implementations, the protective layer is partially chemically inert to an etchant used in a slurry in a subsequent planarization process. In some examples, the protective layer is designed to protect areas of one or more layers of a device when a planar pad is used in a CMP/etching process. The formulation, thickness, and other characteristics, of the protective layer may be designed to increase the probability that when a planar pad removes material from the protective layer, that only a portion of one or more underlying layers is exposed.

The routine 900 continues to operation 906 ("perform CMP/etching process"), where a CMP/etching process is performed on the device. In some configurations, the CMP/etching process comprises the use of a planar pad and a slurry. In some configurations, the slurry may be comprised of one or more chemicals that reduce the hardness of the protective layer. In these configurations, reducing the hardness of the protective layer may reduce the time and/or expense of planing the protective layer to expose a portion of material from an underlying layer.

In other configurations, the slurry may include one or more chemicals that have a high degree of chemical reactivity with material in one or more layers beneath the protective layer. Having a high degree of chemical reactivity may provide for a relative fast (or aggressive) etch. In some configurations, the etching process is configured to remove material from one or more defect regions having raised profiles. The removal of material from the one or more defect may reduce the probability of defective devices.

The routine 900 continues to operation 908 ("remove protective layer"), where the protective layer deposited in operation 904 is removed. In some configurations, the protective layer may be removed using a planarization process. In other configurations, the protective layer may be removed in an etching process. The presently disclosed subject matter is not limited to any particular manner in which the protective layer is removed. The routine 900 may end thereafter.

Figure 10:
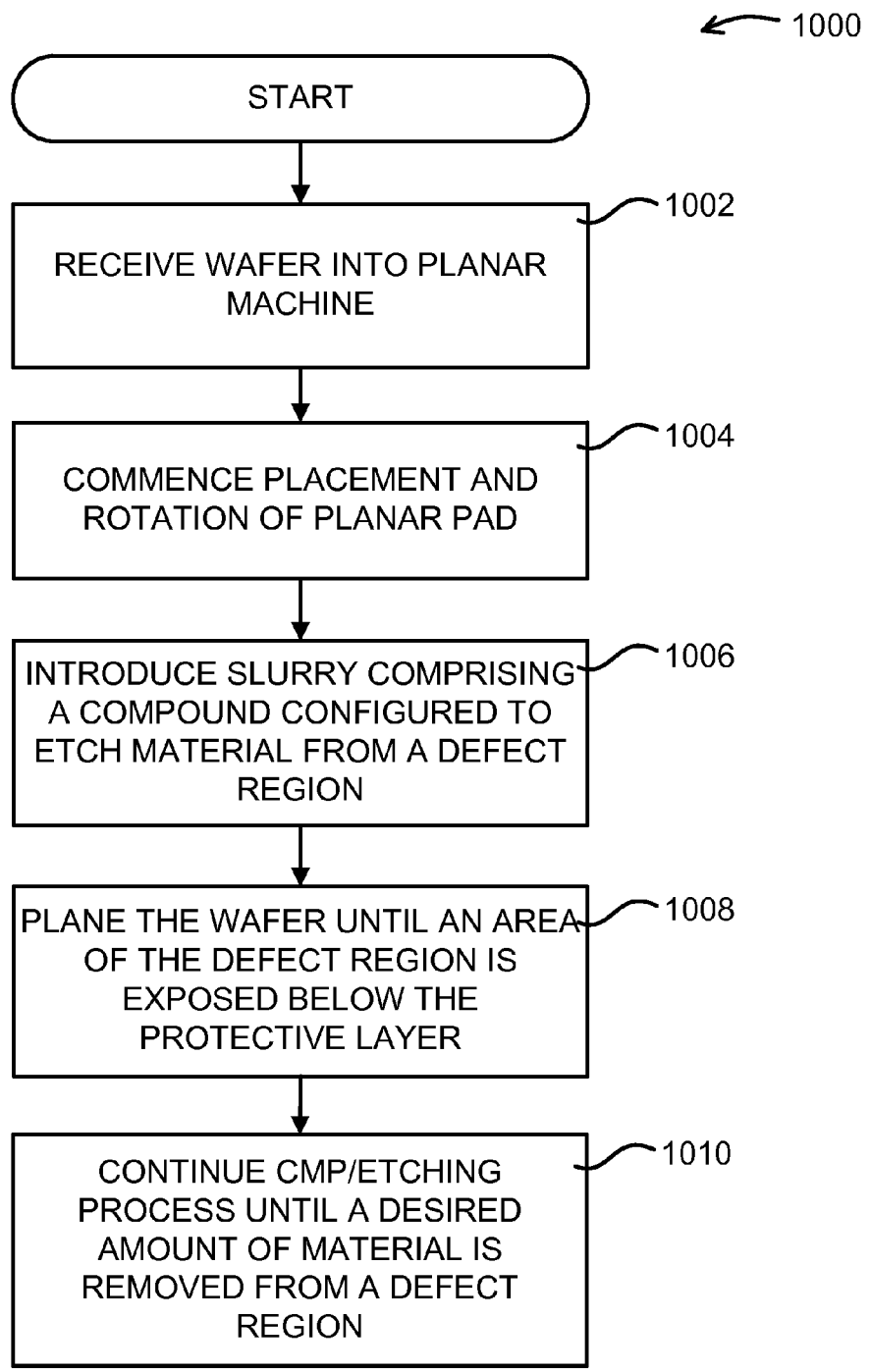
FIG. 10 illustrates one configuration of a routine for a chemical-mechanical polishing/etching process according to at least one embodiment disclosed herein.

FIG. 10 illustrates one configuration of a routine for a chemical-mechanical polishing/etching process, such as the operation 906 of routine 900 in FIG. 9, according to at least one embodiment disclosed herein. The routine 1000 may commence at operation 1002 ("receive a wafer into planar machine"), where a wafer is received into a planar machine. It should be noted that the presently disclosed subject matter is not limited to use with wafers, as other types and shapes of substrates may be used in various aspects of the presently disclosed subject matter. The wafer may have one or more layers that form a device. The wafer may also have a protective layer, described by way of example in operation 904 of FIG. 9.

The routine 1000 may continue to operation 1004 ("commence placement and rotation of planar pad"), where a planar pad is positioned with respect to the wafer and is rotated. As noted above, the placement may be configured to apply a certain pressure to the protective layer of the wafer to cause a certain planarization rate.

Proximate to, or concurrently with operation 1004, the routine may continue to operation 1006 ("introduce a slurry comprising a compound configured to etch material from a defect region"), where a slurry is introduced. The slurry may include one or more compounds configured to provide for an aggressive etch rate of material from one or more defect regions. In some configurations, the slurry may also include one or more compounds, such as distilled water, to lubricate the slurry process and to help remove material removed from the protective layer (or other layers in some configurations). In some configurations, the slurry may also include one or more compounds to reduce the hardness of the protective layer.

The routine 1000 continues to operation 1008 ("plane the wafer until an area of the defect region is exposed below the protective layer"), where the wafer is planed until an area of the defect region is exposed below the protective layer. In some configurations, the planar component of the CMP/etching process is continued until a portion of the protective layer is removed to expose at least a portion of an underlying layer. Once the portion of underlying layer is exposed, etching compounds in the slurry may commence an etching action on the underlying layers. In some configurations, the etching compound is designed to target the material to be removed from defect regions, which are preferably the portions of the underlying material exposed.

The routine 1000 continues to operation 1010 ("continue CMP/etching process until a desired amount of material is removed from a defect region"), where the CMP/etching process is continued until a desired amount of material is removed from a defect region. In some implementations, almost all of material may be removed from a defect region. In other implementations, a relatively small amount of material may be removed, the amount of which may be configured to reduce (or eliminate) the height of the raised profile caused by the defect regions. The routine 1000 may end thereafter.

Figure 11:
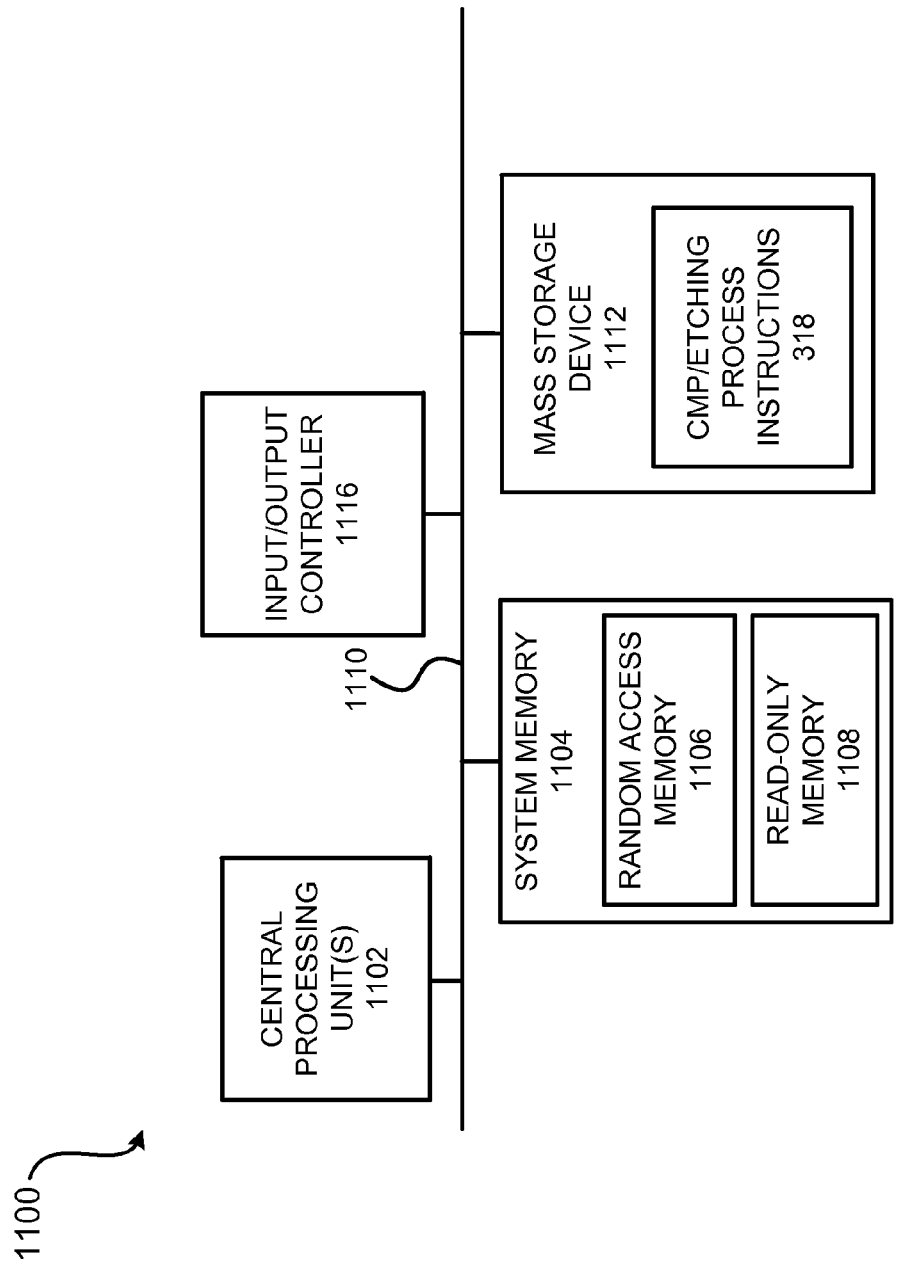
FIG. 11 illustrates a computer in which a process used to reduce the height of a raised profile of a device may be implemented according to at least one embodiment disclosed herein The plurality of figures presented in this application illustrates variations and different aspects of the embodiments of the present disclosure. Accordingly, the detailed description on each illustration will describe the differences identified in the corresponding illustration.

FIG. 11 illustrates a computer in which a process used to reduce the height of a raised profile of a device may be implemented according to at least one embodiment disclosed herein. In some configurations, the computer 1110 may be one or more computers used to control a planar machine, such as the planar machine 314 of FIG. 3. The computer 1100 illustrated in FIG. 11 includes one or more central processing unit(s) ("CPUs") 1102, a system memory 1104, including a random-access memory ("RAM") 1106 and a read-only memory ("ROM") 1108, and a system bus 1110 that couples the system memory 1104 to the CPU 1102. A basic input/output system containing the routines that help to transfer information between elements within the computer 1100, such as during startup, may be stored in the ROM 1108.

The CPUs 1102 may be standard programmable processors that perform arithmetic and logical operations for the operation of the computer 1100, such as the routines 900 and 1000 described above. The CPUs 1102 may perform the operations by transitioning from one discrete, physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits, including registers, adders-subtractors, arithmetic logic units, floating-point units, and the like.

The computer 1100 may also include a mass storage device 1112. The mass storage device may be an optical disk, a magnetic storage device, or a solid state storage device. The mass storage device 1112 may be operative to store CMP/etching process instructions that are configured to control the operation of the planar machine 314.

The computer 1100 may store programs and data on the mass storage device 1112 by transforming the physical state of the mass storage device 1112 to reflect the information being stored. The specific transformation of physical state may depend on various factors, in different implementations of this disclosure. Examples of such factors may include, but are not limited to, the technology used to implement the mass storage device 1112, whether the mass storage device 1112 is characterized as primary or secondary storage, and the like.

For example, the computer 1100 may store information to the mass storage device 1112 by issuing instructions through a storage controller to alter the magnetic characteristics of a particular location within a magnetic disk drive device, the reflective or refractive characteristics of a particular location in an optical storage device, or the electrical characteristics of a particular capacitor, transistor, or other discrete component in a solid-state storage device. Other transformations of physical media are possible without departing from the scope and spirit of the present description, with the foregoing examples provided only to facilitate this description. The computer 1100 may further read information from the mass storage device 1112 by detecting the physical states or characteristics of one or more particular locations within the mass storage device 1112.

The RAM 1106, the ROM 1108, or the mass storage device 1112 may be operative as computer-readable storage mediums. Various aspects of the present disclosure may be stored on other types of computer-readable storage mediums, such as, but not limit to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 1100. It should be understood that when the claims are interpreted in light of this present disclosure, a computer-readable storage medium does not include energy in the form of waves or signals.

The computer 1100 also may include an input/output controller 1116 for receiving and processing input from a number of other devices, including a keyboard, mouse, or electronic stylus. Similarly, the input/output controller 1116 may provide an output to a display screen, a printer, or other type of output device. In some implementations, the input/output controller 1116 may control the operation of one or more mechanisms that control the planar pad 316 or one or more injectors to introduce the slurry 318. One or more embodiments may include a computer-readable storage medium manufactured so that, when read by a properly configured computing device, instructions may be provided to the planar machine 314 to perform operations relating to reducing the height of a raised profile.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

What is claimed is:

1. A method to process a device, comprising:
   epitaxially growing at least one layer of material on a substrate, the at least one layer of material comprising a defect region;
   depositing a protective layer over at least a portion of the at least one layer of material; and performing a chemical-mechanical planarization ("CMP")/etching process comprising
receiving the device into a planar machine,
rotating a planar pad and introducing a slurry comprising an etchant configured to chemically etch the defect region,
planing the device by rotating the planar pad in the presence of the slurry until an area of the defect region is exposed to the slurry, and
continuing the CMP/etching process until at least a portion of the defect region is chemically removed by the etchant.

2. The method of claim 1, further comprising removing the device from the planar machine.

3. The method of claim 1, further comprising removing at least a portion of the protective layer remaining after the CMP/etching process.

4. The method of claim 3, wherein removing at least a portion of the protective layer remaining after the CMP/etching process comprises introducing hydrofluoric acid onto at least a portion of the protective layer to etch the protective layer.

5. The method of claim 1, wherein the slurry comprises a compound configured to reduce a hardness of the protective layer.

6. The method of claim 5, wherein the compound configured to reduce the hardness of the protective layer comprises an oxidizing agent.

7. The method of claim 6, wherein the oxidizing agent comprises peroxides, hydrogen peroxide, hydrohydrogen peroxides, persulfates, percarbonates, and acids and salts thereof.

8. The method of claim 1, wherein the slurry comprises colloidal silica slurry, $H_2O$, NaOCl, and citric acid in a ratio of approximately 800:35:4:3.

9. The method of claim 1, wherein the slurry comprises colloidal silica slurry, $H_2O_2$, and $NH_4OH$ in a ratio of approximately 2000:100:x, wherein x is equal to or greater than 3.

10. A method to process a device, comprising:
epitaxially growing at least one layer of material on a substrate, the at least one layer of material comprising a defect region;
depositing a protective layer over at least a portion of the at least one layer of material; and
performing a chemical-mechanical planarization ("CMP")/etching process comprising
receiving the device into a planar machine,
rotating a planar pad and introducing a slurry comprising an etchant configured to chemically etch the defect region,
planing the device by rotating the planar pad in the presence of the slurry until an area of the defect region is exposed to the slurry, and
continuing the CMP/etching process until at least a portion of the defect region is chemically removed by the etchant so as to form a void having sidewalls that extend through at least a portion of the at least one layer of material.

11. The method of claim 10, wherein the slurry comprises colloidal silica slurry, $H_2O$, NaOCl, and citric acid in a ratio of approximately 800:35:4:3.

12. The method of claim 10, wherein the slurry comprises colloidal silica slurry, $H_2O_2$, and $NH_4OH$ in a ratio of approximately 2000:100:x, wherein x is equal to or greater than 3.

* * * * *